United States Patent
English et al.

(10) Patent No.: US 7,150,553 B2
(45) Date of Patent: Dec. 19, 2006

(54) REPLACEABLE LED LAMP CAPSULE

(75) Inventors: George J. English, Reading, MA (US);
Kun Huang, Manchester, NH (US);
Robert L. Garrison, Bradford, NH (US)

(73) Assignee: Osram Sylvania Inc., Danvers, MA (US)

(*) Notice: Subject to any disclaimer, the term of this patent is extended or adjusted under 35 U.S.C. 154(b) by 164 days.

(21) Appl. No.: 10/646,916

(22) Filed: Aug. 22, 2003

(65) Prior Publication Data

US 2004/0037088 A1 Feb. 26, 2004

Related U.S. Application Data

(62) Division of application No. 09/966,140, filed on Sep. 28, 2001, now Pat. No. 6,682,211.

(51) Int. Cl.
*F21S 8/10* (2006.01)
*F21V 7/20* (2006.01)
*F21V 29/00* (2006.01)

(52) U.S. Cl. .............. 362/545; 362/247; 362/249; 362/294; 362/547; 362/800

(58) Field of Classification Search ........... 362/247, 362/249, 294, 373, 545, 547, 800, 226
See application file for complete search history.

(56) References Cited

U.S. PATENT DOCUMENTS

| 2,087,537 | A | * | 7/1937 | Finkel | 362/249 |
| 5,038,255 | A | * | 8/1991 | Nishihashi et al. | 362/547 |
| 5,561,346 | A | * | 10/1996 | Byrne | 362/240 |
| 5,806,965 | A | * | 9/1998 | Deese | 362/249 |
| 5,929,788 | A | * | 7/1999 | Vukosic | 362/800 |
| 6,161,910 | A | * | 12/2000 | Reisenauer et al. | 362/800 |
| 6,234,648 | B1 | * | 5/2001 | Borner et al. | 362/235 |
| 6,254,262 | B1 | * | 7/2001 | Crunk et al. | 362/545 |
| 6,276,822 | B1 | * | 8/2001 | Bedrosian et al. | 362/545 |
| 6,334,700 | B1 | * | 1/2002 | Ramer et al. | 362/298 |
| 6,580,228 | B1 | * | 6/2003 | Chen et al. | 362/294 |
| 6,634,770 | B1 | * | 10/2003 | Cao | 362/294 |

* cited by examiner

*Primary Examiner*—Alan Cariaso
(74) *Attorney, Agent, or Firm*—William E. Meyer

(57) ABSTRACT

Open LED chips may be arranged directly on the surface of a replaceable lamp capsule without intervening packages that reduce overall light emission. The chips may be oriented in such a way that the lamp generates a unique "donut" shape radiation pattern, which is suitable for a flat and shallow secondary optics to collimate the light into a desired beam pattern, and to reduce the unaesthetic appearance of points of light in an onlooker's view. The LED chips are driven in such a way that one chip fails, the whole lamp fails to avoid a partially lit appearance. At the same time the heat generated by the LED chips may be conducted away by the support structure to possibly vehicle's sheet metal to enhance life of the LED chip. The standardization of this LED lamp makes this product more cost effective thus to be used in broader lighting applications.

21 Claims, 10 Drawing Sheets

REPLACEABLE LED LAMP CAPSULE

This Application is a Divisional of Ser. No. 09/966,140 filed Sep. 28, 2001 now U.S. Pat. No. 6,682,211.

TECHNICAL FIELD

The invention relates to electric lamps and particularly to replaceable automotive lamps. More particularly the invention is concerned with replaceable automotive lamps formed with LED hips.

BACKGROUND ART

Most automotive signal lamps currently use incandescent filaments, gas discharges or light emitting diodes (LEDs) as light sources. Typically the light is reflected by a simple mirrored surface through a cover lens to the illuminated field. The package depths of these assembles are typically about 3 to 6 inches, and they have a projection surface area of 25 square inches or more. To manufacture vehicle lamp thinner than this requires a highly complex reflector and lens system whose components are expensive and susceptible to functional and cosmetic defects.

As initially manufactured, an LED chip is cut from a semiconductor wafer. This initial piece is called a die. LED chips are commonly mounted in a supporting package, which is then mounted as a light source. It is this plastic package enclosing the LED chip what is commonly seen and referred by users as an LED. A portion of the generated light is necessarily lost to the package and the associated reflector structures. Minimizing the package shadow, and maximizing the reflectivity in the package cavity are necessary to achieve a good package design. None the less, even a good package cavity absorbs a significant amount of the generated light. The degree of absorption can be significant in automotive lighting where electrical efficiency, minimal size, and minimal weight are important objectives. The typical frame and reflector structure are usually so close to the LED chip that they trap the heat that then reduces the life of the LED chip. LEDs provide small, relatively efficient light sources, but to generate sufficient total light, many LEDs must be ganged together. As a result, when the LED's are used in an optical system they commonly appear as an unaesthetic cluster of bright dots. There is then a need for a different mounting scheme to more effectively use the generated light from an LED. There is also a need to reduce the heat generated by the LEDs to enhance their life. There is a further need for a different mounting and optical system to create a more esthetic light pattern from the light generated by the LEDs.

DISCLOSURE OF THE INVENTION

A vehicle light source may be formed as a replaceable lamp capsule having a support defining a lamp axis extending in a forward direction towards a field to be illuminated, the support directly supports one or more LED chips, each LED chip having a predominate LED axis of light emission, the majority of the LED chips being oriented so their respective LED axis's form an angle with the forward lamp axis direction of ninety or more degrees. The emitted light may then be directed by a reflector in the forward direction.

BEST MODE FOR CARRYING OUT THE INVENTION

Figure 1:
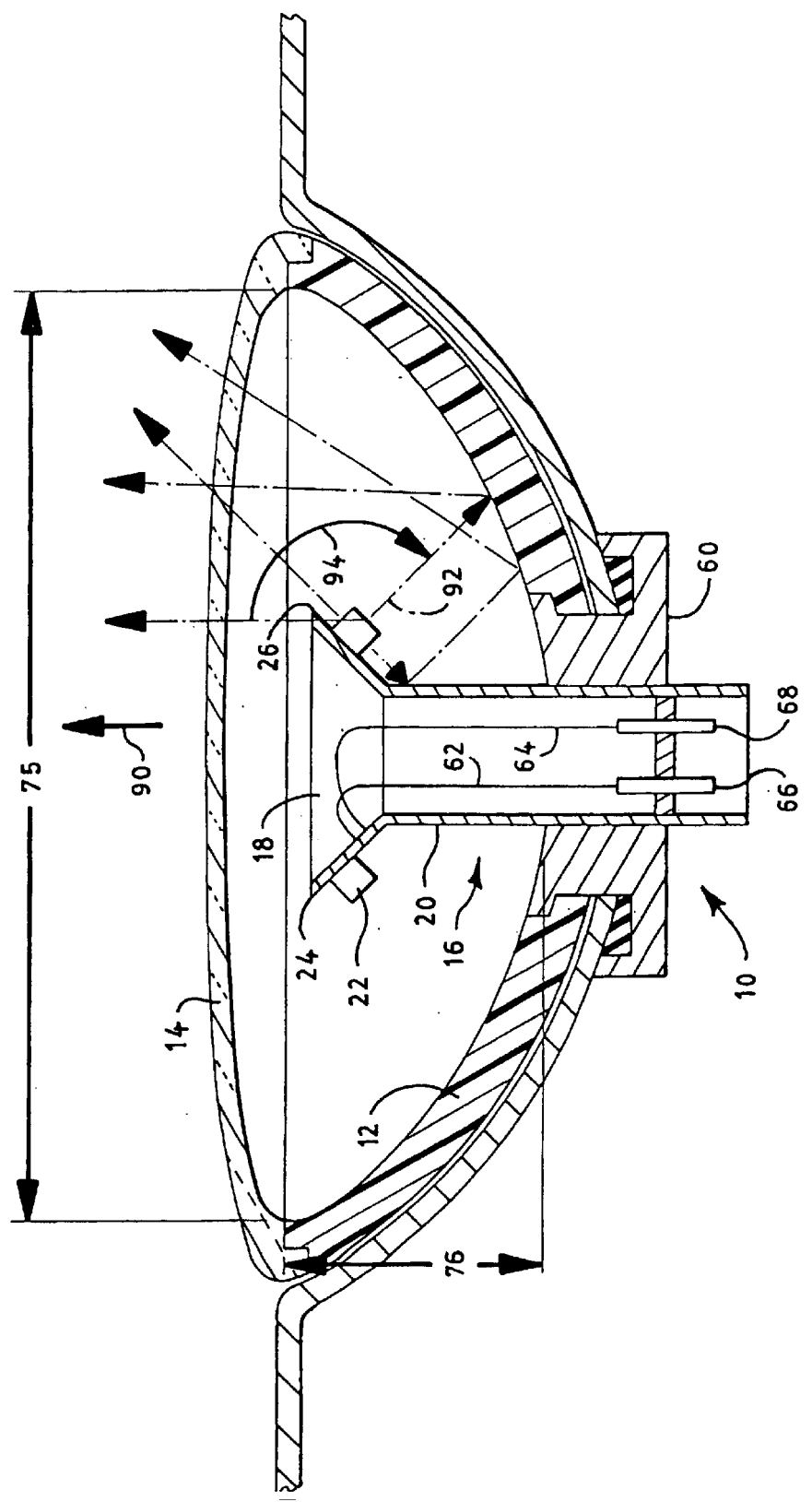
FIG. 1 shows a cross sectional, schematic view of a lamp assembly.

The preferred LED chip lamp system comprises a replaceable LED lamp capsule 10 that fits in a reflector 12 and lens 14 housing. The preferred replaceable LED lamp capsule 10 comprises a support 16, for one or more LED chips 22. FIG. 1 shows a schematic lamp capsule positioned in a smooth reflector and lens housing. The lamp capsule is held in position by a bayonet coupling to the reflector that is held in a shallowly indented vehicle hull, and sealed with a compressed ring type seal. Light from the LED is substantially blocked from forward (axis 90) view, but is projected sideways and then generally reflected forward. The capsule 10 may of course be similarly located in other housing structures.

The preferred support 16 is formed from a material with high heat conductivity, such as a metal. The preferred support 16 has an umbrella or mushroom like shape with a head 18 portion and a base 20 portion. The head 18 and base 20 portions may be aspects of a single piece or may be separately formed provided, in the preferred embodiment, they are coupled to enable good heat conduction from the supported LED's 22. For example, head 18 and base 20 may each be formed from metal and then screwed or otherwise joined together.

The head 18 provides a surface to mount LED chips 22 on so as to generally face away from the field to be illuminated and towards the base 20 or reflector 12. The support defines a lamp axis 90 extending in a forward direction towards a field to be illuminated, and each LED chip has a predominate LED axis of light emission. In the preferred embodiment, a majority of the LED chips are oriented so their respective LED axis 92 forms an angle 94 with the forward lamp axis direction of ninety or more degrees. Further, each LED chip has a field of illumination, and each radially positioned LED chip is oriented and has a sufficiently broad field of illumination to overlap at least partially at least the fields of illumination of its respective nearest neighbor LED chips. In one embodiment the head 18 has the general shape of a frustum of a cone with the broader base portion facing towards the field of illumination, so a conic side faces the reflector 12. The head 18 then has a circumferential edge 24 and an inward facing surface 26. One or more LED chips 22 are supported on the surface 26, and are electrically coupled in series.

Figure 2:
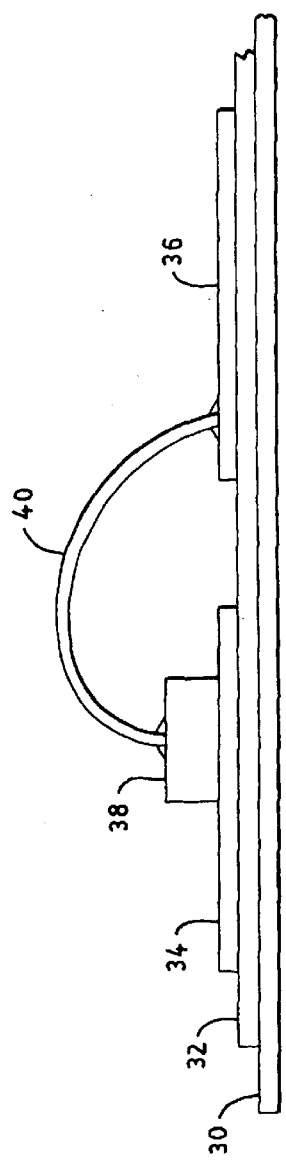
FIG. 2 shows a cross sectional view of an LED mounting.
Figure 3:
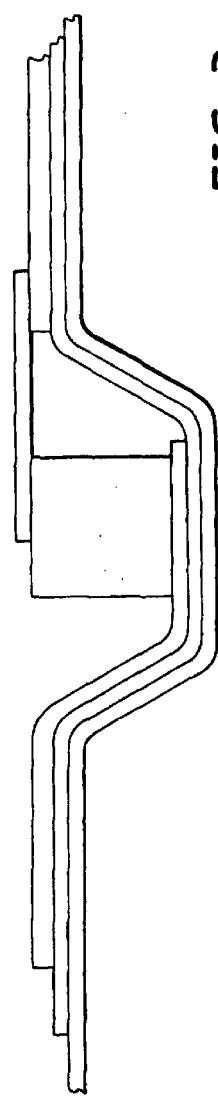
FIG. 3 shows an alternative cross sectional view of an LED mounting.

A series circuit for the LED chips may be formed directly on the surface of the head 18. An appropriate pattern of dielectric layers and conductive lines may be laid out on the surface 26 of the support 16 generally, head 18 or base 20 creating a series of coupling regions or pads for the individual LED chips 22 interlinked by electrical supply lines. FIG. 2 shows a substrate 30, coated with a dielectric 32 that in turn supports conductive lines 34, 36. An LED chip 38 is supported on a first side to a pad area of line 34. A bridge wire 40 couples a second side of the LED chip 38 to the second line 36. FIG. 3 shows a similar stricture wherein the substrate is indented to form a well to contain the LED chip. In a preferred embodiment the LED chips are mounted in an indented wells formed in the head. In the bottom of a first well is a conductive cathode pad that a first LED chip is mounted on. When in position an anode wire extends approximately horizontally from the top of the LED chip to a contact point made at the rim of the first well to a conductive extension that leads to an adjacent second well and a second cathode pad contact provided in the second well. This pattern then extends around the head providing a series circuit of the several LED chips. The head may be formed as a separate disk with a sloped surface that is populated with LED chips by rotating it on an assembly lathe. The disk is then coupled to a base portion of the support, and appropriate electrical connections are made to the series circuit.

Figure 4:
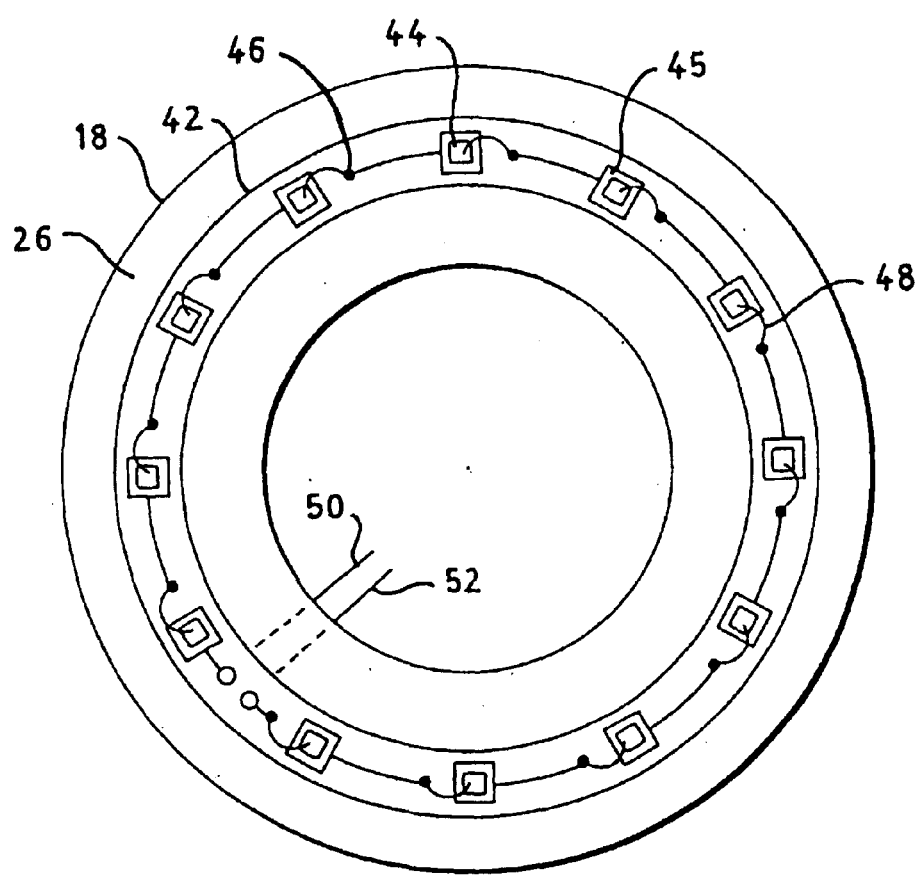
FIG. 4 shows a transverse view of a support with a single band of LED chips.
Figure 5:
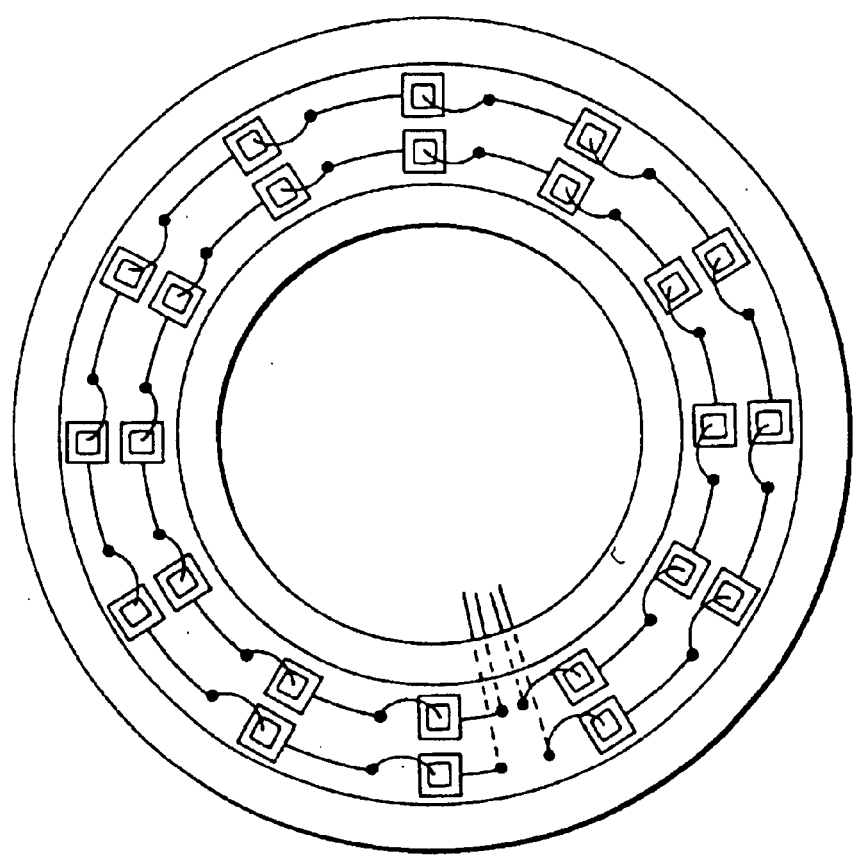
FIG. 5 shows a transverse view of a support with a multiple bands of LED chips.

Known photochemical methods may be used to create the circuitry. The LED chips 22 are then mounted directly on the pads to complete the circuit. FIG. 4 shows a transverse view of a head 18 with a single band of mounted LED chips. Encircling the side surface 26 of the head 18 is a dielectric band 42. A series of twelve conductive pads 45 electrically linking to bridge points 46 are symmetrically spaced along the dielectric band 42. Twelve LED chips 44 are then mounted to respective pads 45 to electrically couple to the bottom sides of the LED chips 44. This bottom side coupling also provides heat conduction to the head 18, from the LED chips 44, and orients the LED chips 44 to properly direct the emitted light. Spanning from the bridge points 46 to the tops of the next adjacent respective LED chip 44 are bridge wires 48. Coupled to the start and endpoints of the series circuit are a first lead wire 50 and a second lead wire 52. The lead wire 50, 52 are ducted through the core of the support 16 for electrical connection on the exterior of the assembly. LED chips are commonly coated to seal against moisture and to protect the connecting wires to the chip. Here an appropriate coating, such as a silicone or similar material as known in the art may overcoat the LED chip assembly and connections (not shown). Two or more series groupings may also be created, with each grouping providing a different color, or so that two or more light levels are available. One lamp capsule for example may then provide red, amber and white light according to different circuit selections. Similarly, multiple rings of the same color LED chip may be used for low and high light outputs. FIG. 5 shows a transverse view of a head 18 with multiple bands of LED chips.

Figure 6:
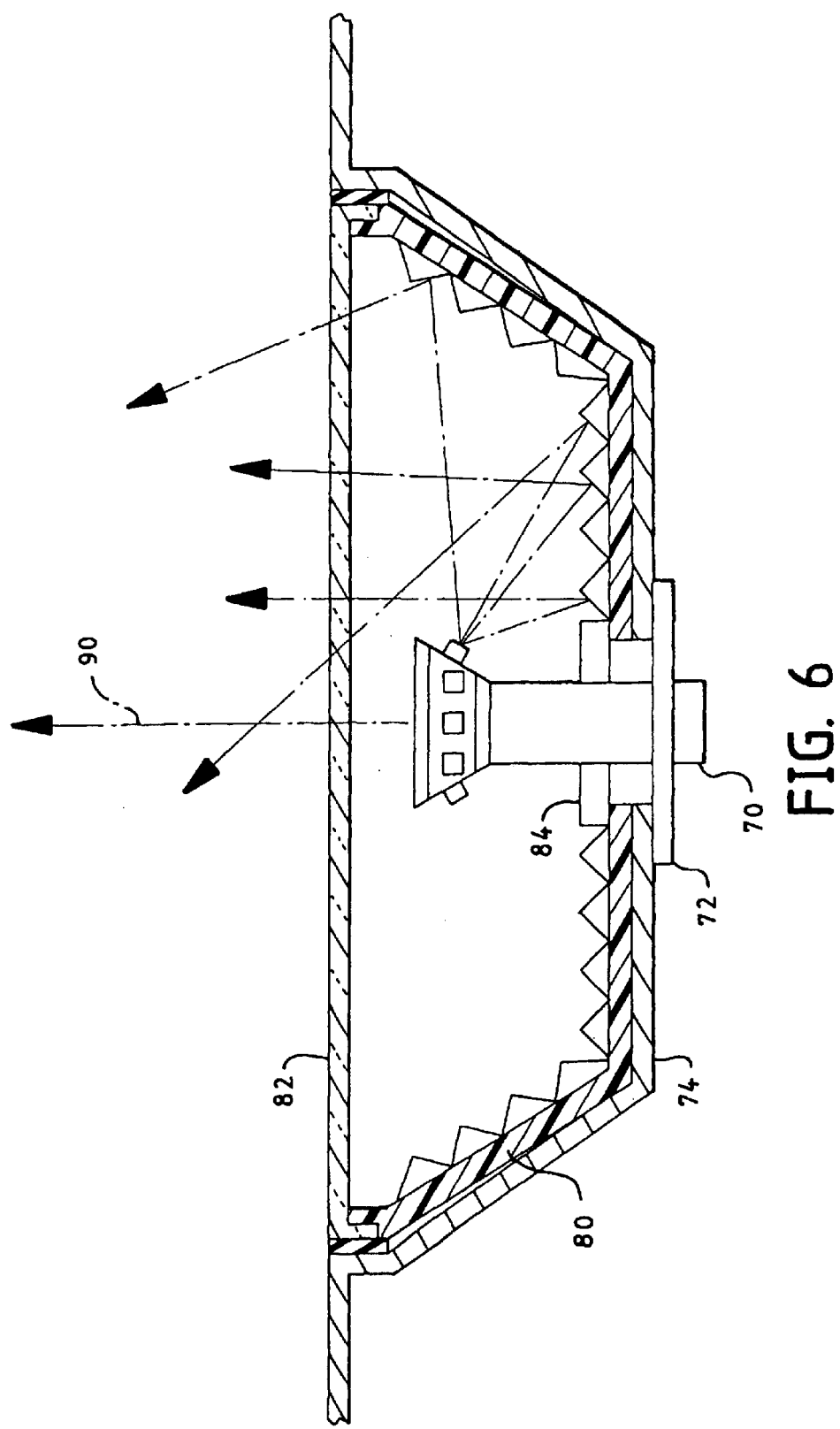
FIG. 6 shows a cross sectional, schematic view of a lamp assembly with a Fresnel type reflector.

The preferred base 20 further includes a coupling 60 to latch with a portal formed in an optical housing such as a reflector 12 and lens 14. The coupling 60 may be a bayonet, threaded, or similar coupling 60 as may be conveniently selected as a matter of design choice. The electrical lead 62, 64 are similarly ducted through the coupling 60 to enable electrical contacts on the exterior of the optical housing, for example by lugs 66, 68. In the preferred embodiment the support 16 is made of metal, and has a coupling 60 providing direct metal to metal contact with the vehicle thereby enabling good thermal conduction away from the LED chips 22 to the vehicle. The base 20 portion then acts to axially extend the LED chips 22 to a proper depth in the optical housing formed by the reflector 12 and lens 14 cavity. In another variation, support 16 has sufficient surface area that thermal radiation from the head 18 and base 20 is sufficient to keep the LED chips 22 cool. No thermal contact is then needed between the base 20 and the vehicle. In another variation, the base 20 portion may include on an exterior side cooling fins or other heat dissipating structures exposed on the exterior of the base 20. FIG. 6 shows a lamp capsule 70 with a thermally conductive flange 72 abutting a vehicle hull 74 used as a heat sink.

In the preferred embodiment the LED chips 22 are coupled on the edge of the circumferential edge of the mushroom head 18 or on a side surface of the base 20 so as to generally face the reflector 12. Light from the LED chips 22 is then cast substantially in the direction of the base 20, and the reflector 12. Little or no light is shown directly into the illuminated field. Light from a side edge of an LED chip 22 may be cast directly in the forward direction. Light cast from the brightest surface, usually the top, of the LED chip 22 is substantially cast in the direction of the reflector 12. In the preferred positioning, the LED chips 22 are positioned sufficiently close to each other around the support 16 circumference so that adjacent LED chips 22 cast over lapping light patterns onto regions of the reflector 12. This light is then reflected forward in an appropriately spread, focused or otherwise directed pattern. By overlapping the LED chip 22 source light on the reflector 12, the individual dot patterns typical of the LED chips 22 are merged into a larger, less sharply segmented pattern. In a similar fashion, the light cast towards the base 20 may be reflected from the surface of the base 20 towards the reflector 12, where it is reflected again and merged into the overall projected light pattern. The base 20 may be made reflective to enhance this reflection. The individuality of each LED chip 22 is then substantially hidden in the overall light pattern, and the dotted character of the final light pattern is diminished.

LED chips 22 can currently provide up to about 4 lumens each at about 50 milliamps. Some are more efficient than others, and various colors are available. The number of LED chips needed for a lamp capsule depends on the lamp purpose and the efficiency of the LED chips. A standard vehicle turn signal needs about 35 lumens projected into the field of illumination. Currently, LED chips with average performances provide about 2.7 lumens each, so about 13 LED chips are needed to provide the necessary amount of light. LED efficiencies are rising rapidly, and currently LEDs with 40 lumens per watt are projected for delivery in the year 2001. Cost and life of the LED chips are relevant issues in the selection of LED chips. On balance it is believed that a larger number of less bright LED chips, oriented to overlap their respective light patterns provides better light distribution and is more economical.

The LED chips 22 are cut out of their original manufacture as approximately square plates having a side length of about 0.30 millimeters. The actual size may vary according to the appropriate LED chip design. An LED chip typically supplies 10 percent of the total emitted light from each of its four side surfaces. Approximately 60% of the emitted light is emitted from the top square surface. Little or no light is emitted from the back of the LED chip. The light distribution pattern at each emission point along the LED chip is substantially Lambertian. The LED chip is mounted in a preferred optical system that allows the light from the LED chip 22 to be distributed in a uniform manner. The radiation from the LED source is preferably made as uniform as possible to reduce eye fatigue and health hazards, and eliminate the unaesthetic dotted look.

In the preferred embodiment, LED chips 22, meaning the semiconductor elements without individual enclosing plastic optical structures are mounted directly on the support 16. It is understood that direct mounting may include intervening dielectric and conductive layers necessary for electrical operation of the chip. Directly mounted refers to a mechanical connection sufficient to provide good thermal conduction from the LED chip to the support. Without the typical enclosing typical encapsulation structures, there is then little or no light lost from the LED chip 22 to those structures as is typical of encapsulated LEDs. The natural light distribution can then be used directly in solving a particular task lighting task. The protective coating can be further formed to increase a preferred light distribution for the LED capsule. For example, the coating material may form a lens, an entry to an optical fiber or a similar refractive or reflective element to guide the light. This is an important function for providing the thinnest optical package, for example one less than a centimeter thick.

Direct mounting of the LED chips also leads to little or no trapped heat, and the heat that is generated is efficiently conducted away through the support, preferably to a large surrounding mass, like a vehicle body. Heat sinking the LED chips to the vehicle hull substantially increases the LED chip 22's expected life. In one embodiment of the invention, the lamp capsule 10 is fixed to the vehicle sheet metal forming the vehicle hull to ensure heat transfer and a reference location. The fast rate of heat transfer from the LED chip 22 is highly desirable. Conducting heat from the LED chip 22 reduces the junction temperature that otherwise leads to excursion and LED life failures.

The preferred lamp assembly has a reflector 12 having a reflective surface offset from and arranged around the support 16 to reflect light emitted by the LED chips 22 towards a field to be illuminated. A preferred reflector 12 is generally dish shaped with a greater diameter 75 than height 76. In the preferred embodiment the height 75 of the reflector 12 is less than 5.0 centimeters. The particular shape of the reflective surface to achieve a preferred beam pattern is a matter of design choice thought to be within the skill of optical designers. An alternatively preferred reflector is a Fresnel type reflector 80. The Fresnel reflector 80 enables an axially less deep optical housing. FIG. 6 shows a cross sectional, schematic view of a lamp assembly with a Fresnel type reflector. A retainer, such as the hull of a vehicle 74 is formed with a shallow indentation. A reflector 80 and lens 82 housing are positioned in the indentation. The lamp capsule 70 is inserted through passages in the vehicle hull 74 and reflector and latched in place for example by a bayonet assembly 84. The latch presses a heat conductive flange 72 against the vehicle hull 74 that then acts as a heat sink for the lamp capsule 70. Light from the LED chips is initial projected in a predominantly radially direction. The Fresnel reflector allows the light to be reflected in a predominantly axial direction, while enabling the axial dimension of the reflector to be reduced in comparison to a smooth reflector. The height of the capsule 70, the angle of the LED chips from the capsule axis 90, and the faceting of the reflector 80 may all be varied to effect the light distribution in the resulting beam.

The preferred lamp assembly 10 has a light transmissive lens 14 cooperating with the reflector 12 to substantially enclose the support 16 and transmit light emitted directly from the LED chips and light reflected by the reflector 12. A clear polycarbonate lens 14 similar to those used in automotive lighting is suggested. The lens 14 may include any number of various lens elements as is common to automotive lighting. In the preferred embodiment the lens 14 has a material thickness of about 1 or 2 millimeters, with an overall thickness due to curvature of only a few centimeters. When in position to cooperate with the lamp capsule 10, the preferred reflector 12 and lens 14 combination has an overall thickness of 7.0 centimeters. It is understood that making the optical package thicker is not difficult, making it thinner can be. In the preferred embodiment the reflector 12 and lens 14 assembly is less than 3 or 4 centimeters thick. An assembly about 2.5 centimeters has been built, and it is expected that assemblies about 1.0 centimeters deep can be constructed. The lens 14 cover may be clear or colored, such as red or amber, and may or may not include lens features.

Figure 11:
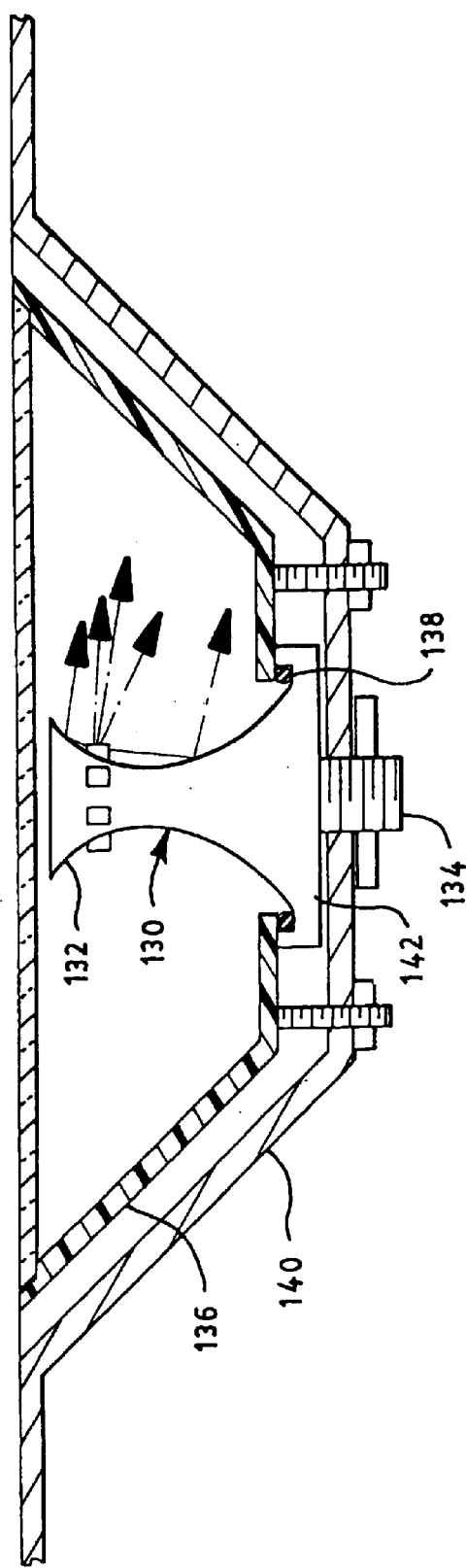
FIG. 11 shows an alternative cross sectional, schematic view of a lamp assembly mounting.

Mounting the LED chips 22 on a metal support 16 such as that shown results in FIG. 1, in a non-symmetrical, for example toroidal, light distribution. The highest light output is approximately normal to the support 16 surface (axis 90). The "donut" light distribution pattern is useful for making a relatively flat optical packages as shown in FIGS. 1, 6 and 11. The uniformity of the intensity pattern around the support 16 is enhanced by using a larger number of ordinary (and less expensive) LED chips 22, for example ten to twenty or more in comparison to using fewer, for example four, but higher output LED (and more expensive) chips placed 90 degrees apart. Also distributing the larger number of lower output LED chips 22 around the support 16 allows heat to be more efficiently and safely conducted to the support 16, than if fewer, but higher output LED's were used. One may seek a single most efficient LED as a source on the belief that a single, highly efficient LED chip provides the least overall cost. In fact, the light from a single LED chip is so concentrated that it acts like a filament, and the light from it needs to be spread and directed by reflectors and lenses, which cost money also. The efficient balance lies in having the least expensive lens and reflector system that meets the task. This indirectly implies more, but less bright LED chips to spread the light sooner rather than later.

If a source is built with ten or twelve LED chips 22, then light from several LED chips, perhaps three to five LED chips 22 direct light onto each point of the reflector 12. The remaining LED chips 22 are behind (obscured by) the support 16. The light intensity along the reflector surface then varies, by perhaps only 10 to 20% depending on the number of LED chips 22 that can be seen, but this distribution is substantially more even compared to straight on viewing of an LED array.

By mounting the LED chips directly on the support 16, a higher total light output may be achieved, than would be possible if the LED chips 22 are packaged in SMT packages. Similarly, by mounting the LED chips on the support 16, a substantial amount of heat is conducted away, thereby preserving the lamp's life. No measurements of life improvement have been made by the Applicants, but it understood to be true on engineering principles. The series construction reduces the need for high output, and high cost LED chips providing 4 to 6 lumens each. The overall structure enables the construction of a standardized LED bulb. Different housing structures and styles can then be designed around the standard lamp capsule. This tends to eliminate redesign of the lamp and the reflector and therefore minimizes the overall lamp and vehicle cost. The LED capsule has a substantially reduced package depth, allowing vehicle makers to reduce the size of cuts in the body hull for lamps.

Figure 7:
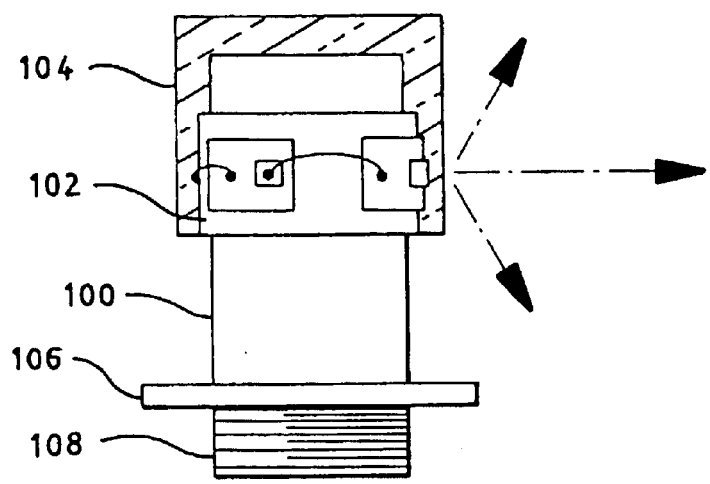
FIG. 7 shows a side perspective view of an alternative capsule structure.

FIG. 7 shows a side perspective, schematic view of an alternative capsule structure. The support 100 is substantially cylindrical. A dielectric band 102 encircles the support 100. A series of separated conductive pads are positioned around the support. LED chips are positioned on the conductive pads. Bridge wires couple adjacent LED chips to the neighboring conductive pad thereby forming a series circuit. The input leads and output leads to the circuit (not shown) are ducted through the support 100. A clear protective coating 104 extends over the LED chips. The base includes a heat conductive flange 106, and a threaded coupling 108 to press the flange to a heat sink.

Figure 8:
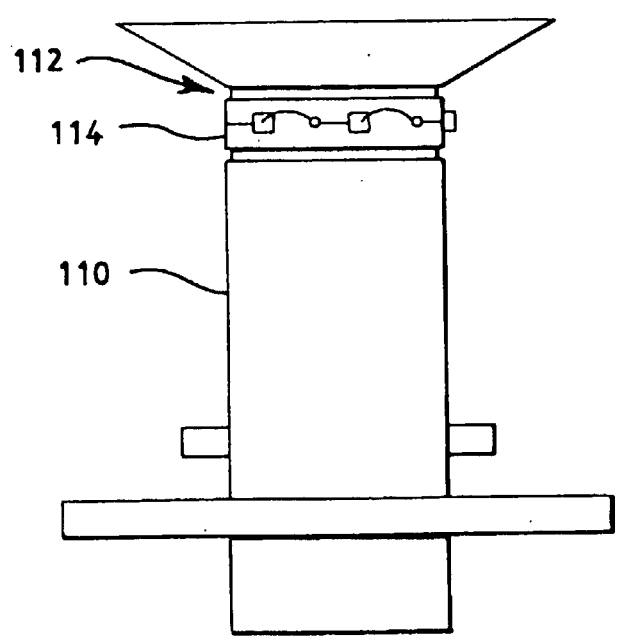
FIG. 8 shows a side perspective view of an alternative capsule structure.

FIG. 8 shows a side perspective, schematic view of an alternative capsule structure. The support 110 is substantially cylindrical with a circumferential groove 112. The LED chips are initially supported on and pre-wired on a circular band, or a flexible band 114 that may be bent around the support 110. The band 114 acts as an intermediate support that enables pre-mounting of the LED chips in a high-speed operation. The band of LED chips is coupled to the support, for example by constraining it in a groove. Again, the input leads and output leads to the circuit (not shown) are ducted through the support.

Figure 9:
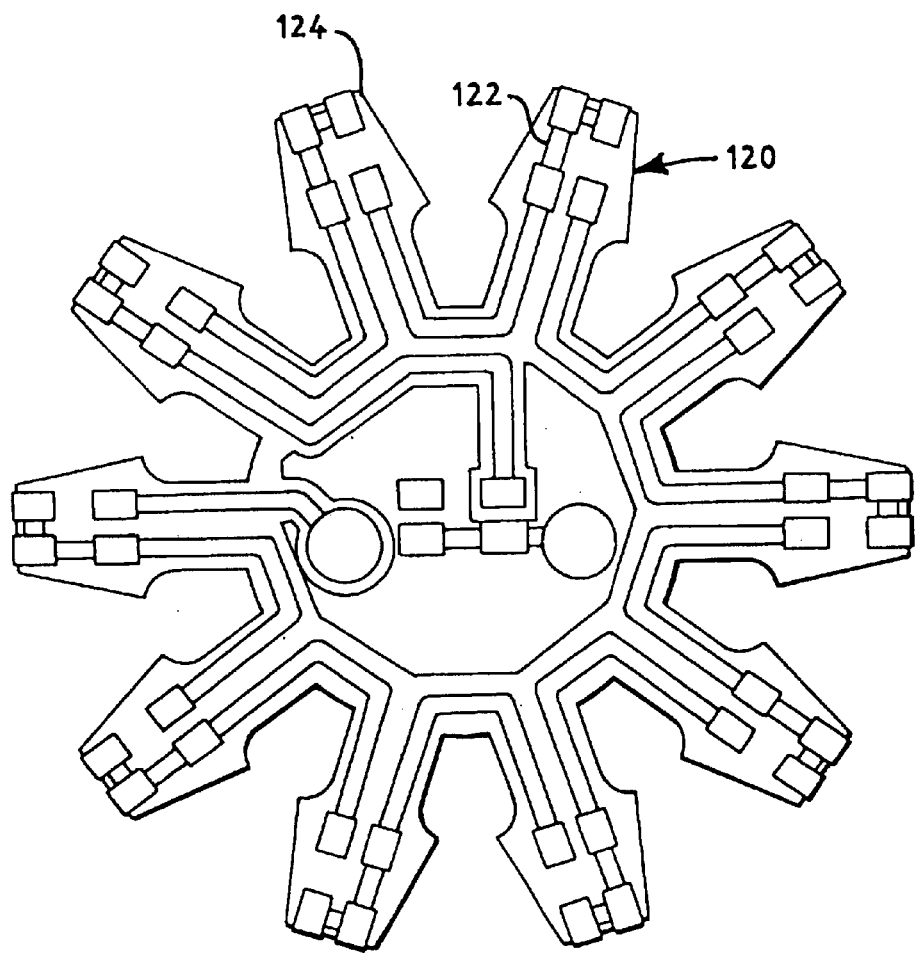
FIG. 9 shows a flexible mounting.

FIG. 9 shows a flexible dielectric mounting 120 for a circuit of LED chips. The circuit is formed on a flexible plastic material in the form of a hub with eight project spokes. Conductive metal traces 122 are formed on the hub and spokes 124. One trace extends from in input contact on the hub out a first of the spokes to an anode contact. A second lead extends back from the first spoke and then out an adjacent second spoke. The second lead has three cathode contacts positioned on the end of the first spoke and at the opposite end anode contact formed on the end of the second spoke thereby providing mounting areas for an LED SMTs or LED chip if alternatively formatted as previously described. Similar second leads continue the circuit layout around the hub and spokes to end with a final out put contact in the hub area. The encapsulated LED SMTs are then mounted on the anode and cathode contacts. A central LED SMT may also be mounted in the hub area. The circuit then provides a series coupling for nine LEDs. The hub and spoke structure is then mounted on the support and leads coupled to provide power. The flexible spokes are then bent over the edge of the cap to position the LED capsules on the inner rim of the support and held in place by an appropriate means, for example glued by epoxy, snapped in a formed groove, pinned down by a snap ring, or other mechanical means as one skilled in the art may elect as a matter of design choice. It is anticipated that vehicle electronics will rise to be 42-volt systems, which would support longer serial chains of LED chips.

Figure 10:
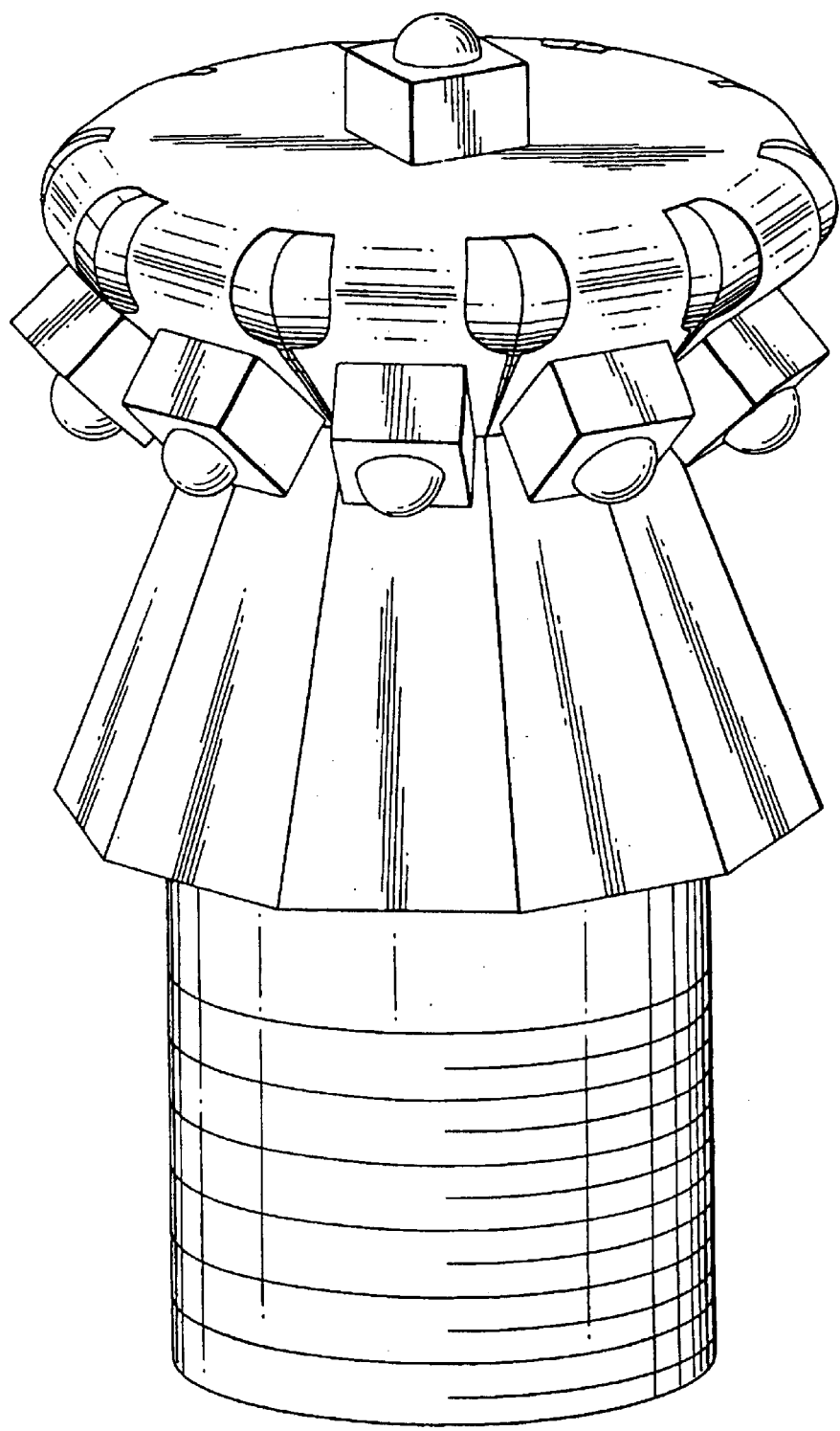
FIG. 10 shows a lamp capsule supporting a flexible mounting.

FIG. 10 shows a lamp capsule supporting such a flexible mounting. The mounting supports SMTs that have been bent into position underneath the umbrella like head of the support. The support is made of metal and has a threaded base. The lower sidewall of the support provides a reflective skirt to direct light sideways away from the support.

FIG. 11 shows an alternative cross sectional, schematic view of a lamp assembly mounting. The vehicle hull 140 is indented a small amount, for example by a 2 or 3 centimeters. Several mounting holes may be formed in the indented region. An LED capsule is mounted in one of the openings, with a heat conducting flange 142 made between the LED capsule and the vehicle hull 140. A heat conductive flange 142 on the LED capsule is pressed on one side against the hull 140 with the assembly held by a thread shaft 134 and nut assembly. The flange 142 then provides a thermal coupling to the vehicle hull 140 to conduct heat away from the LED chip. An optical assembly may be mounted over the LED capsule, pressing against a seal 138 mounted on the second side of the flange 142. The optical assembly may include a reflector 136 and lens defining an enclosed cavity for the LED capsule. The optical assembly may be similarly attached to the vehicle hull 140 for example by threaded shafts and nuts. It is understood that clips, bayonet latches or any of a variety of similar known mechanical couplings may be chosen to mount the LED bulb or the optical housing to the vehicle hull. Similarly the seal may be structured in a variety of known formats. The support 130 has curved reflective surfaces 132 to direct light sideways from the support 130.

Figure 12:
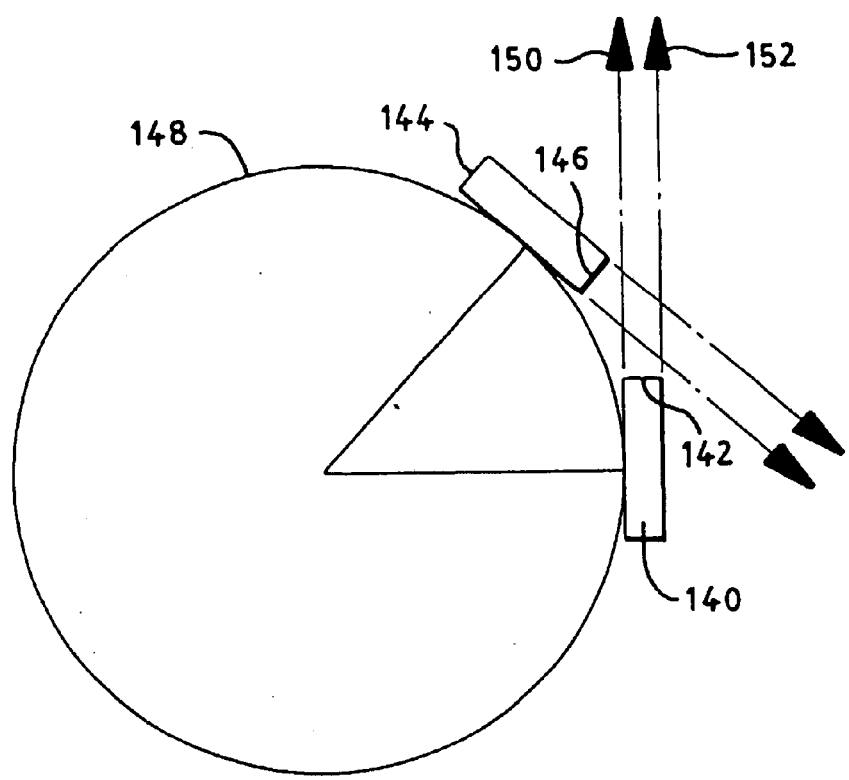
FIG. 12 shows a schematic layout of LEDs around a support.

FIG. 12 shows a schematic layout of LEDs around a support. LEDs emit a substantial amount of light from their side faces. If they are mounted too closely they mutually interfere with the total emission. The preferred arrangement is to position the LED chips around the support so that the side wall emissions from adjacent LEDs pass unobstructed over the adjacent LED. The particular spacing depends on the radius (curvature) of the support, the thickness and any mounting height of the LED chip and the width of the LED chip. Simple geometry then determines a maximum permitted number of LEDs that can be mounted without shading the total output. In FIG. 12 a first LED chip 140 having a side wall 142 and a second LED chip 144 having a similar side wall 146 are each arranged approximately tangential to the support 148 to face perpendicularly away from the support 148. Each LED chip 140, 144 and the respective side walls 142, 146 are adjacent one another, albeit separated one from another by a distance. The support 148 has sufficient curvature intermediate the first LED chip 140 and the second LED chip 144 such that light emissions rays 150, 152 normal to the first LED side wall 142 pass unintercepted over the second LED side wall 146 the field to be illuminated, which may be a reflector surface. Equally the rays normal to side wall 146 miss side face 142.

In operation, a voltage is generally applied to the series of LED chips with a value of approximately 2.5 times the number of LED chips in the series. The applied voltage can be supplied by a simple power supply. In the event one LED fails, the whole lamp then goes out, leading the user to seek a proper replacement. If the LED chips are connected in parallel, successive LED failures then go un-noticed as the light dims slightly with each LED chip failure. These successive failures deceive the user into believing the lamp is still adequate when in fact insufficient light is actually being provided.

While there have been shown and described what are at present considered to be the preferred embodiments of the invention, it will be apparent to those skilled in the art that various changes and modifications can be made herein without departing from the scope of the invention defined by the appended claims.

What is claimed is:

1. A vehicle light source comprising:

a lamp capsule having a support, wherein the support includes an umbrella like head portion, a plurality of LEDs mounted on the support, and positioned with respect to the head portion so that the head portion is substantially intermediate the LEDs and the field to be illuminated, wherein the support is made from material having a high thermal conductivity to conduct heat away from the plurality of LEDs.

2. The vehicle light source in claim 1,
wherein the lamp capsule is replaceable, and
wherein the support includes a base structure having a thermally conductive connection to a heat sink.

3. The vehicle light source in claim 2, wherein the connection is to an attached spacially extended heat radiator forming a portion of the lamp capsule.

4. The vehicle light source in claim 3, wherein the heat radiator is a flange.

5. The vehicle light source in claim 3, wherein the connection is a thermally conductive coupling to a thermally conductive portion of a vehicle.

6. The vehicle light source in claim 2, wherein the LEDs are mounted in a plurality of bands extending around the support.

7. The vehicle light source in claim 2, wherein the LEDs are arranged in a plurality of separate circuits coupled to separate inputs enabling alternative light outputs.

8. The vehicle light source in claim 2, wherein the support is substantially cylindrical.

9. A vehicle light assembly comprising:
a) a replaceable lamp capsule having a support defining a lamp axis extending in a forward direction towards a field to be illuminated, one or more LEDs mounted on the support, each LED having a predominate LED axis of light emission, the majority of the LEDs being oriented so the respective LED axes form an angle with respect to the forward lamp axis direction of ninety or more degrees;
b) a reflector having reflective surface formed with a rear opening to receive the LEDs of the lamp capsule therethrough, the reflector further having a height measured along an axis of the reflector and a maximal diameter measured transverse to the axis, wherein the reflector is offset from and oriented with respect to a majority of the LEDs to intercept the LED axes, and reflect light emitted from the LEDs generally in the forward direction to the field to be illuminated,
c) wherein the ratio of the reflector diameter to the reflector height is more than 1.0, and
d) wherein the reflector height is less than 5.0 centimeters.

10. The vehicle light assembly in claim 9, further including a lens enclosing the lamp capsule in the reflector, wherein the reflector and lens assembly has an interior axial measurement from an inner face of the lens to an transverse plane intersecting the reflector at the formed opening of less than 4.0 centimeters.

11. A vehicle light assembly of claim 9, further including a coupling to mount the vehicle light assembly in an indentation formed in a vehicle hull.

12. A vehicle light source comprising:
a replaceable lamp capsule having a support, a plurality of LEDs mounted on the support, wherein the support is made from material having a high thermal conductivity to conduct heat away from the plurality of LEDs,
wherein the support includes a base structure having a thermally conductive connection to a heat sink
wherein the support is substantially cylindrical, and
wherein the base structure includes a heat conductive flange and a coupling to press the flange to a thermally conductive portion of a vehicle hull.

13. A vehicle light source comprising:
a replaceable lamp capsule having a support, a plurality of LEDs mounted on the support, wherein the support is made from material having a high thermal conductivity to conduct heat away from the plurality of LEDs,
wherein the support includes a base structure having a thermally conductive connection to a heat sink, and
wherein the LEDs are supported on an intermediate flexible substrate, and the flexible substrate is bent to conform with the exterior contour of the support, the flexible substrate being mechanically coupled to the support.

14. The vehicle light source in claim 13, wherein for flexible substrate is thermally coupled to the support for heat conduction from LEDs through the flexible substrate to the support.

15. The vehicle light source in claim 13, wherein the flexible substrate is supported in a groove formed on the support.

16. The vehicle light source in claim 13, wherein the LEDs are supported respectively on spoke portions of a flexible hub and spokes structure.

17. The vehicle light source in claim 16, wherein the hub and spoke structure provides an electrical connection in the hub portion.

18. The vehicle light source in claim 16, wherein the support includes a lower sidewall including a reflective skirt directing light from the LEDs away from the support.

19. A vehicle light source comprising:
a replaceable lamp capsule having a support, a plurality of LEDs mounted on the support, wherein the support is made from material having a high thermal conductivity to conduct heat away from the plurality of LEDs,
wherein the support includes a base structure having a thermally conductive connection to a heat sink, and
wherein the support includes an umbrella like head portion, and the LEDs are mounted with the head portion positioned substantially intermediate the LEDs and the field to be illuminated.

20. A vehicle light assembly comprising:
a lamp capsule having a support, wherein the support includes an umbrella like head portion,
a plurality of LEDs mounted on the support, and positioned with respect to the head portion so that the head portion is substantially intermediate the LEDs and the field to be illuminated, thereby substantially blocking direct view of the LEDs, wherein the support is made from material having a high thermal conductivity to conduct heat away from the plurality of LEDs, wherein the support defines a lamp axis extending in a forward direction towards a field to be illuminated, and the plurality of LEDs mounted on the support each LED have a predominate LED axis of light emission, the majority of the LEDs being oriented so the respective LED axes form an angle with respect to the forward lamp axis direction of ninety or more degrees; and
a reflector having reflective surface formed with a rear opening to receive the LEDs of the lamp capsule there through, the reflector further having a height measured along an axis of the reflector and a maximal diameter measured transverse to the axis, wherein the reflector is offset from and oriented with respect to a majority of the LEDs to intercept the LED axes, and reflect light emitted from the LEDs generally in the forward direction to the field to be illuminated.

21. The vehicle light assembly in claim 20, wherein the support includes a lower sidewall including a reflective skirt directing light from the LEDs away from the support.

* * * * *